(12) United States Patent
Tanaka et al.

(10) Patent No.: US 10,994,339 B2
(45) Date of Patent: May 4, 2021

(54) SURFACE-COATED CUTTING TOOL

(71) Applicants: SUMITOMO ELECTRIC HARDMETAL CORP., Itami (JP); Sumitomo Electric Industries, Ltd., Osaka (JP)

(72) Inventors: Keizo Tanaka, Itami (JP); Makoto Setoyama, Itami (JP); Haruyo Fukui, Itami (JP); Akira Kobayashi, Mie-gun (JP); Koji Kuramochi, Itami (JP)

(73) Assignees: Sumitomo Electric Hardmetal Corp., Itami (JP); Sumitomo Electric Industries, Ltd., Osaka (JP)

( * ) Notice: Subject to any disclaimer, the term of this patent is extended or adjusted under 35 U.S.C. 154(b) by 189 days.

(21) Appl. No.: 16/067,201

(22) PCT Filed: Nov. 22, 2017

(86) PCT No.: PCT/JP2017/042036
§ 371 (c)(1),
(2) Date: Jun. 29, 2018

(87) PCT Pub. No.: WO2018/105403
PCT Pub. Date: Jun. 14, 2018

(65) Prior Publication Data
US 2019/0022763 A1 Jan. 24, 2019

(30) Foreign Application Priority Data
Dec. 9, 2016 (JP) .............................. JP2016-239435

(51) Int. Cl.
*B23B 27/14* (2006.01)
*B23D 77/00* (2006.01)
(Continued)

(52) U.S. Cl.
CPC ............ *B23B 27/148* (2013.01); *B23B 51/00* (2013.01); *B23C 5/16* (2013.01); *B23D 77/00* (2013.01);
(Continued)

(58) Field of Classification Search
CPC . B23B 27/14; C23C 14/0635; C23C 14/0641; C23C 14/0664
(Continued)

(56) References Cited

U.S. PATENT DOCUMENTS 5,656,383 A * 8/1997 Tanaka ................ C23C 14/0664
428/699
6,250,855 B1 * 6/2001 Persson ................... C22C 29/08
51/309

(Continued)

FOREIGN PATENT DOCUMENTS

EP 0709483 A2 5/1996
EP 0947607 A2 10/1999
(Continued)

*Primary Examiner* — Archene A Turner
(74) *Attorney, Agent, or Firm* — Baker Botts L.L.P.; Michael A. Sartori

(57) ABSTRACT

A surface-coated cutting tool includes a substrate composed of cemented carbide and a coating film. The coating film includes an intermediate layer in contact with the substrate and an upper layer formed on the intermediate layer. The upper layer is made up of a single layer consisting of an upper base layer which is a layer in contact with the intermediate layer or multiple layers constituted of two or more layers. A mismatch in lattice interplanar spacing in an interface region between the substrate and the intermediate layer is not higher than 65% of a theoretical value of a mismatch in lattice interplanar spacing between the substrate and the upper base layer. A mismatch in lattice interplanar spacing in an interface region between the intermediate layer and the upper base layer is not higher than 65% of the
(Continued)

theoretical value of the mismatch in lattice interplanar spacing between the substrate and the upper base layer.

4 Claims, 3 Drawing Sheets

(51) Int. Cl.
| | |
|---|---|
| *B23B 51/00* | (2006.01) |
| *B23C 5/16* | (2006.01) |
| *C23C 14/06* | (2006.01) |
| *B23G 5/06* | (2006.01) |
| *B23F 21/00* | (2006.01) |
| *C23C 14/32* | (2006.01) |

(52) U.S. Cl.
CPC ............... *B23F 21/00* (2013.01); *B23G 5/06* (2013.01); *C23C 14/0635* (2013.01); *C23C 14/0641* (2013.01); *C23C 14/0664* (2013.01); *C23C 14/325* (2013.01); *B23B 2224/36* (2013.01); *B23B 2228/08* (2013.01); *B23B 2228/10* (2013.01); *B23C 2224/36* (2013.01); *B23C 2228/08* (2013.01); *B23C 2228/10* (2013.01); *B23D 2277/2414* (2013.01); *B23D 2277/2485* (2013.01)

(58) Field of Classification Search
USPC ........... 51/307, 309; 428/336, 697, 698, 699
See application file for complete search history.

(56) References Cited

U.S. PATENT DOCUMENTS

| | | | |
|---|---|---|---|
| 7,410,707 B2* | 8/2008 | Fukui | .................... C23C 30/005 |
| | | | 51/307 |
| 2013/0065081 A1* | 3/2013 | Ni | .......................... C23C 28/042 |
| | | | 428/660 |
| 2014/0193623 A1* | 7/2014 | Setoyama | ............... B23B 27/14 |
| | | | 428/336 |
| 2015/0275348 A1 | 10/2015 | Joesaar et al. | |
| 2016/0175939 A1 | 6/2016 | Tanaka et al. | |

FOREIGN PATENT DOCUMENTS

| | | |
|---|---|---|
| JP | H07-310173 A | 11/1995 |
| JP | H08-127862 A | 5/1996 |
| WO | 2015/186503 A1 | 12/2015 |

\* cited by examiner

SURFACE-COATED CUTTING TOOL

TECHNICAL FIELD

The present invention relates to a surface-coated cutting tool. The present application claims priority to Japanese Patent Application No. 2016-239435 filed on Dec. 9, 2016, the entire contents of which are herein incorporated by reference.

BACKGROUND ART

A surface-coated cutting tool of which various characteristics represented by wear resistance have been improved by forming a coating film on a surface of a substrate has been known. Technical development for improving adhesiveness between a substrate and a coating film by providing an intermediate layer (a lowermost layer of the coating film which is in contact with the substrate) between the substrate and the coating film in a surface-coated cutting tool of such a type has been promoted [for example, Japanese Patent Laying-Open No. 07-310173 (PTD 1), Japanese Patent Laying-Open No. 08-127862 (PTD 2), and International Publication WO2015/186503 (PTD 3)].

CITATION LIST

Patent Document

PTD 1: Japanese Patent Laying-Open No. 07-310173
PTD 2: Japanese Patent Laying-Open No. 08-127862
PTD 3: International Publication WO2015/186503

SUMMARY OF INVENTION

A surface-coated cutting tool according to one manner of the present disclosure is a surface-coated cutting tool including a substrate composed of cemented carbide and a coating film formed on the substrate. The coating film includes an intermediate layer in contact with the substrate and an upper layer formed on the intermediate layer. The upper layer is made up of a single layer consisting of an upper base layer which is a layer in contact with the intermediate layer or multiple layers constituted of two or more layers including the upper base layer. The substrate has a hexagonal crystal system. The intermediate layer and the upper base layer have an NaCl crystal structure. The intermediate layer has a thickness not smaller than 3 nm and not greater than 10 nm. A mismatch in lattice interplanar spacing in an interface region between the substrate and the intermediate layer is not higher than 65% of a theoretical value of a mismatch in lattice interplanar spacing between the substrate and the upper base layer. A mismatch in lattice interplanar spacing in an interface region between the intermediate layer and the upper base layer is not higher than 65% of the theoretical value of the mismatch in lattice interplanar spacing between the substrate and the upper base layer.

DETAILED DESCRIPTION

Figure 1:
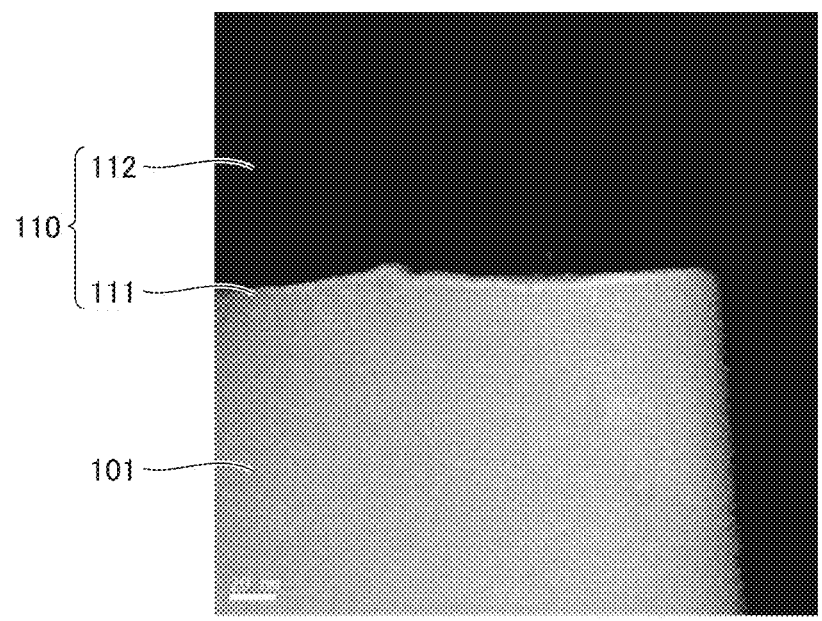
FIG. 1 shows a photograph substituted for a drawing of a cross-sectional STEM image (an LAADF-STEM image) showing one example of an interface between a substrate and a coating film in a surface-coated cutting tool according to one manner of the present disclosure.

Problem to be Solved by the Present Disclosure

PTD 1 discloses a hard coating film coated tool in which a metal intermediate layer composed of AlTi is formed on a surface of a substrate and a hard coating film composed of TiAlN is formed on the metal intermediate layer. In the hard coating film coated tool in PTD 1, however, a hardness and oxidation resistance of the hard coating film tend to adversely be affected by the intermediate layer composed of a metal. PTD 2 discloses a stack including an intermediate layer between a stack portion and a substrate in which adhesiveness between the intermediate layer and the stack portion is improved by continuous crystal lattices between the intermediate layer and the stack portion. There is a room for improvement, however, in adhesiveness of the stack in PTD 2, because the intermediate layer has a thickness from 0.02 to 5 μm, residual stress tends to be introduced, and interlayer peeling starting from the intermediate layer tends to occur during cutting.

PTD 3 discloses a surface coated tool which achieves improved adhesiveness between a substrate and a coating film by providing an intermediate layer between the substrate and the coating film, the intermediate layer being continuous in crystal lattice to the coating film and also to the substrate. The surface coated tool in PTD 3, however, tends to be low in strength due to amorphousness of the inside of the intermediate layer, which results in lowering also in adhesiveness between the substrate and the coating film. There is thus a room for improvement in this regard.

When adhesiveness between the substrate and the coating film is not sufficient, a lifetime of a tool tends to be short, for example, under a severe cutting condition in which a difficult-to-cut material such as stainless steel or Inconel® is adopted as a work material.

In view of the above, an object of the present disclosure is to provide a surface-coated cutting tool which is excellent in adhesiveness between a substrate and a coating film and can withstand also a severe cutting condition.

Effect of the Present Disclosure

According to the above, a surface-coated cutting tool which is excellent in adhesiveness between a substrate and a coating film and can withstand also a severe cutting condition can be provided.

DESCRIPTION OF EMBODIMENTS OF PRESENT INVENTION

Embodiments of the present invention will initially be listed and described.

[1] A surface-coated cutting tool according to one manner of the present disclosure is a surface-coated cutting tool including a substrate composed of cemented carbide and a coating film formed on the substrate. The coating film includes an intermediate layer in contact with the substrate and an upper layer formed on the intermediate layer. The upper layer is made up of a single layer consisting of an upper base layer which is a layer in contact with the intermediate layer or multiple layers constituted of two or more layers including the upper base layer. The substrate has a hexagonal crystal system. The intermediate layer and the upper base layer have an NaCl crystal structure. The intermediate layer has a thickness not smaller than 3 nm and not greater than 10 nm. A mismatch in lattice interplanar spacing in an interface region between the substrate and the intermediate layer is not higher than 65% of a theoretical value of a mismatch in lattice interplanar spacing between the substrate and the upper base layer. A mismatch in lattice interplanar spacing in an interface region between the intermediate layer and the upper base layer is not higher than 65% of the theoretical value of the mismatch in lattice interplanar spacing between the substrate and the upper base layer. According to such features, the surface-coated cutting tool is excellent in adhesiveness between the substrate and the coating film and can exhibit a stable long lifetime even under a severe cutting condition.

[2] In the surface-coated cutting tool, the intermediate layer preferably contains a carbide, a nitride, or a carbonitride containing at least one element selected from the group consisting of elements forming the upper base layer and at least one element selected from the group consisting of elements forming the substrate. Since the intermediate layer thus contains both of an element forming the substrate and an element forming the upper base layer, it can exhibit chemical affinity for both of the substrate and the upper base layer and adhesiveness between the substrate and the coating film can further be improved.

[3] The group consisting of the elements forming the upper base layer preferably includes Ti, Cr, Al, and Si, which the intermediate layer preferably contains. Since the intermediate layer thus establishes firm bond also with carbon or the like contained in cemented carbide representing a material for the substrate, resistance to peeling can be improved.

[4] In the surface-coated cutting tool, the upper base layer is preferably a TiN layer.

DETAILS OF EMBODIMENTS OF PRESENT INVENTION

Though an embodiment of the present invention (hereinafter also denoted as the "present embodiment") will further be described hereinafter in detail, the present embodiment is not limited thereto. Though the description will be given below with reference to drawings, in the present specification and the drawings, the same or corresponding elements have the same reference characters allotted and the same description thereof will not be repeated.

An expression in a format "A to B" herein means the upper limit and the lower limit of a range (that is, not smaller than A and not greater than B). When a unit is not given for A but a unit is given only for B, A and B are common in unit. When a compound is herein expressed with a chemical formula and when an atomic ratio is not particularly limited, all atomic ratios that have conventionally been known are encompassed and the atomic ratio should not necessarily be limited only to those in a stoichiometric range. For example, when an expression "TiAlN" is given, a ratio among atoms which form TiAlN is not limited only to Ti:Al:N=0.5:0.5:1 but all atomic ratios that have conventionally been known are encompassed.

<<Surface-Coated Cutting Tool>>

FIG. 1 is a schematic partial cross-sectional view showing one example of an interface between a substrate and a coating film in a surface-coated cutting tool according to the present embodiment. As shown in FIG. 1, a surface-coated cutting tool includes a substrate 101 composed of cemented carbide and a coating film 110 formed on substrate 101. Coating film 110 includes an intermediate layer 111 in contact with substrate 101 and an upper layer formed on intermediate layer 111. In FIG. 1, an upper base layer 112 which is a layer in contact with intermediate layer 111 in the upper layer appears.

The surface-coated cutting tool can suitably be used as a cutting tool such as a drill, an end mill, a throwaway tip for milling or turning, a metal saw, a gear cutting tool, a reamer, a tap, or a tip for pin milling of a crankshaft. Each element forming the surface-coated cutting tool will be described below.

<Substrate>

Substrate 101 is composed of cemented carbide. Substrate 101 has a hexagonal crystal system. Examples of such cemented carbide include tungsten carbide (WC).

Substrate 101 contains, for example, WC—Co based cemented carbide and the WC—Co based cemented carbide contains WC particles and a binder phase containing cobalt (Co) and binding the WC particles to one another.

So long as substrate 101 contains WC and has the hexagonal crystal system, it can contain any component other than these. For example, other than the WC particles, a nitride, a carbide, or a carbonitride of Co, titanium (Ti), tantalum (Ta), or niobium (Nb) may be added, or an impurity inevitably introduced during manufacturing may be contained. Furthermore, free carbon or an abnormal layer called a "η layer" may be contained in a structure. A surface of substrate 101 may be reformed. For example, a beta (β)-free layer may be formed on the surface of substrate 101.

The WC particles in substrate 101 preferably have a particle size not smaller than 0.2 μm and not greater than 2.0 μm and a content of Co is preferably not lower than 4.0 mass % and not higher than 13.0 mass %. The binder phase (Co) is softer than the WC particles. Therefore, when the surface of substrate 101 is subjected to ion bombardment treatment which will be described later, the binder phase is removed and the WC particles are exposed at the surface. Here, when the particle size of the WC particles and the content of Co in a cemented carbide structure occupy the ranges above, fine projections and recesses originating from grain boundaries of the WC particles are formed in the surface of substrate 101. By forming coating film 110 on such a surface, adhesiveness between coating film 110 and substrate 101 can be improved by what is called an anchor effect.

A particle size of a WC particle can be found by cutting the surface-coated cutting tool, polishing a cut surface thereof, and observing the cut surface with a scanning electron microscope (SEM) or a transmission electron microscope (TEM) similarly to the method of measuring a thickness of a coating film which will be described later. A diameter of a circle circumscribing a WC particle (a diameter corresponding to a circumcircle) in a field of view of observation is regarded as a particle size of the WC particle. The WC particles have a particle size more preferably not greater than 1.5 μm. A content of Co is more preferably not higher than 11.0 mass % and particularly preferably not higher than 10.0 mass %.

A composition of substrate 101 can be specified by analyzing a cut surface of the substrate with an energy dispersive X-ray (EDX) spectrometer associated with an SEM or a TEM. A composition of substrate 101 is preferably found by analyzing a plurality of (for example, three) cut surfaces with EDX and calculating an average value.

<Coating Film>

Coating film 110 includes intermediate layer 111 in contact with substrate 101 and an upper layer formed on intermediate layer 111. The upper layer may be made up of a single layer consisting of upper base layer 112 which is a layer in contact with intermediate layer 111 or multiple layers constituted of two or more layers including upper base layer 112. The entire surface of substrate 101 is preferably coated with coating film 110. Coating film 110, however, should only be provided at least in a cutting edge portion, and it does not necessarily have to evenly cover the entire surface of substrate 101. Namely, an embodiment in which a coating film is not partially formed on substrate 101 or an embodiment in which a stack structure of a coating film is partially different is also encompassed in the present embodiment. Coating film 110 includes intermediate layer 111 and the upper layer. Coating film 110 can include a coloring layer composed of TiN as an uppermost layer (an outermost surface layer) in the upper layer.

The total thickness of coating film 110 is preferably not smaller than 0.5 μm and not greater than 15 μm. When the thickness is smaller than 0.5 μm, the coating film is too small in thickness and a lifetime of the tool may be short. When the thickness exceeds 15 μm, chipping tends to occur in an early stage of cutting and the lifetime of the tool may be short. The total thickness of coating film 110 is more preferably not smaller than 0.5 μm and not greater than 10 μm and particularly preferably not smaller than 1.0 μm and not greater than 5.0 μm.

At least intermediate layer 111 and upper base layer 112 of intermediate layer 111 and the upper layer forming coating film 110 have an NaCl crystal structure. At least crystal grains of a compound of which intermediate layer 111 is composed and crystal grains of a compound of which upper base layer 112 is composed have the NaCl crystal structure. A hardness of the coating film is thus improved, which can contribute to a longer lifetime of the tool. All crystals of the compound of which intermediate layer 111 and the upper layer are composed are more preferably crystalline. When the coating film is amorphous in its entirety or in part, a hardness of the coating film may be lowered and a lifetime of the tool may become short.

A thickness of the coating film can herein be measured by cutting a surface-coated cutting tool and observing a cut surface with an SEM or a TEM. In observation, the cut surface is desirably subjected to surface treatment with a focused ion beam (FIB) apparatus or a cross section polisher (CP). Furthermore, a composition of each layer can also be found with the use of an energy dispersive X-ray (EDX) spectrometer associated with an SEM or a TEM at the cut surface. Specifically, a magnification for observation with the SEM or the TEM is set to 2000 to 10000×, a thickness is measured at five locations in one field of view, and an average value thereof is regarded as a thickness of the coating film. A method of measuring a thickness of the intermediate layer will be described later.

<Upper Layer and Upper Base Layer>

The upper layer may be made up of a single layer consisting of upper base layer 112 which is a layer in contact with intermediate layer 111 or multiple layers constituted of two or more layers including upper base layer 112 as described above. The upper layer can include in its entirety or in part, a modulation structure in which a composition of a compound forming the layer periodically varies in a direction of thickness or a super-multi-layered structure in which two or more types of unit layers different in composition having a thickness not smaller than 0.2 nm and not greater than 20 nm are periodically and repeatedly stacked. Upper base layer 112 can be a lowermost layer of the modulation structure or the super-multi-layered structure.

The upper layer preferably contains one or more elements selected from group IV elements [Ti, Zr (zirconium), and Hf (hafnium)], group V elements [V (vanadium), Nb, and Ta], and group VI elements [Cr (chromium), Mo (molybdenum), and W] in the periodic table and Si and Al and one or more elements selected from C, N, and O.

Specific examples of the compound forming the upper layer can include TiCN, TiN, TiCNO, $TiO_2$, TiNO, TiSiN, TiSiCN, TiAlN, TiAlCrN, TiAlSiN, TiAlSiCrN, AlCrN, AlCrCN, AlCrVN, AlN, AlCN, $Al_2O_3$, ZrN, ZrCN, ZrN, $ZrO_2$, HOC, HfN, HfCN, NbC, NbCN, NbN, $Mo_2C$, WC, and $W_2C$. These compounds may further also be doped with a small amount of another element.

The upper layer is composed of the compound described above so that wear resistance of coating film 110 is improved. In particular, upper base layer 112 may also be a TiN layer.

<Intermediate Layer>

Intermediate layer 111 is formed in a portion in contact with substrate 101. As the surface-coated cutting tool includes intermediate layer 111, peel-off of coating film 110 is suppressed and a lifetime of the tool is extended as compared with a conventional example. Intermediate layer 111 has a thickness not smaller than 3 nm and not greater than 10 nm. When intermediate layer 111 has a thickness smaller than 3 nm, an effect to improve adhesiveness between substrate 101 and coating film 110 does not tend to be obtained. When intermediate layer 111 has a thickness exceeding 10 nm, residual stress in intermediate layer 111 tends to become high and peel-off tends to occur to the contrary. Intermediate layer 111 has a thickness more preferably not smaller than 3 nm and not greater than 5 nm.

Intermediate layer 111 preferably contains a carbide, a nitride, or a carbonitride containing at least one element selected from the group consisting of elements of which upper base layer 112 is composed and at least one element selected from the group consisting of elements of which substrate 101 is composed. The group consisting of the elements of which the upper base layer is composed preferably includes any of Ti, Cr, Al, and Si, which the intermediate layer preferably contains. Since intermediate layer 111 thus contains a constituent element of substrate 101 and upper base layer 112, it can exhibit high chemical affinity for both of substrate 101 and upper base layer 112 and can achieve improved adhesiveness with these layers. Since Ti, Cr, Al, and Si establish firm bond with carbon in the WC particles contained in cemented carbide representing a material for the substrate, resistance to peeling is improved.

Figure 2:
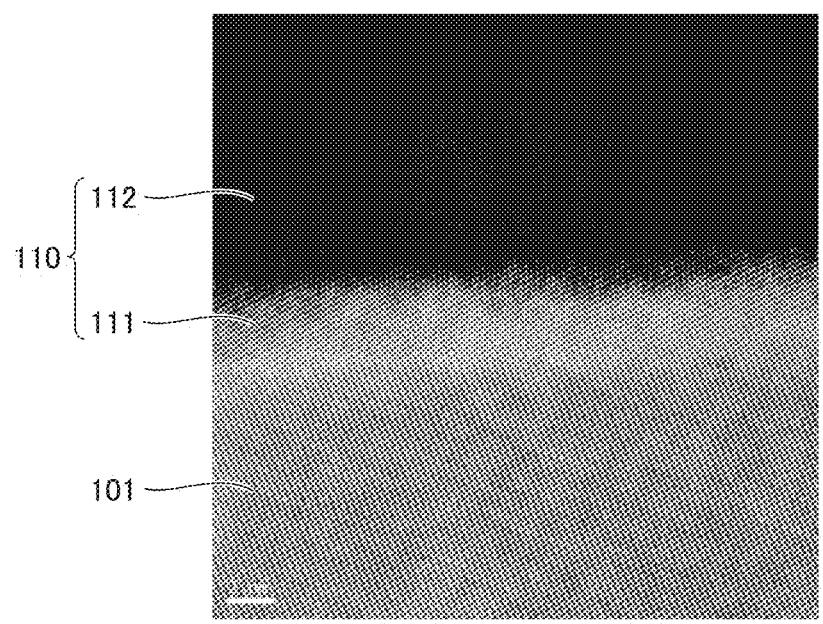
FIG. 2 shows a photograph substituted for a drawing showing the cross-sectional STEM image in FIG. 1 as being enlarged.

When intermediate layer 111 composed as such is formed, crystal lattices are substantially continuous at an interface between substrate 101 and intermediate layer 111 and an interface between intermediate layer 111 and upper base layer 112 as shown in FIG. 2. It is thus understood that adhesiveness between substrate 101 and coating film 110 has improved. FIG. 2 shows an enlarged cross-sectional STEM image in FIG. 1 (at a magnification of 5000000×). In FIG. 2, atoms are observed to evenly spread in dots at three brightness levels. It can be seen from this state that intermediate layer 111 having a thickness not smaller than 3 nm and not greater than 10 nm is formed at the interface between substrate 101 (the WC particles) and upper base layer 112 (a 2-nm scale being shown in lower left in FIG. 2). It can be confirmed that crystal lattices are present in intermediate layer 111, the crystal lattices are substantially continuous at the interface between substrate 101 and intermediate layer 111, and the crystal lattices are substantially continuous also at the interface between intermediate layer 111 and upper base layer 112.

Specific examples of a carbide, a nitride, or a carbonitride forming intermediate layer 111 can include [a] to [j] as follows. Intermediate layer 111 can contain one or more of these compounds.

[a] a carbide, a nitride, or a carbonitride containing Ti and W (for example, TiWC, TiWN, or TiWCN)

[b] a carbide, a nitride, or a carbonitride containing Cr and W (for example, CrWC, CrWN, or CrWCN)

[c] a carbide, a nitride, or a carbonitride containing Ti, Cr, and W (for example, TiCrWC, TiCrWN, or TiCrWCN)

[d] a carbide, a nitride, or a carbonitride containing Ti, Al, and W (for example, TiAlWC, TiAlWN, or TiAlWCN)

[e] a carbide, a nitride, or a carbonitride containing Ti, Si, and W (for example, TiSiWC, TiSiWN, or TiSiWCN)

[f] a carbide, a nitride, or a carbonitride containing Ti, Cr, Al, and W (for example, TiAlCrWC, TiAlCrWN, or TiAlCrWCN)

[g] a carbide, a nitride, or a carbonitride containing Ti, Cr, Si, and W (for example, TiSiCrWC, TiSiCrWN, or TiSiCrWCN)

[h] a carbide, a nitride, or a carbonitride containing Ti, Al, Si, and W (for example, TiAlSiWC, TiAlSiWN, or TiAlSiWCN)

[i] a carbide, a nitride, or a carbonitride containing Ti, Cr, Al, Si, and W (for example, TiAlSiCrWC, TiAlSiCrWN, or TiAlSiCrWCN)

[j] a carbide, a nitride, or a carbonitride obtained by substituting the entirety or a part of Cr in [a] to [i] above with one or more elements selected from Ti, Zr, and Nb <Non-Metallic Composition of Intermediate Layer>

A suitable example in which intermediate layer 111 is composed of a carbonitride and upper base layer 112 is composed of a nitride in a surface-coated cutting tool will be described. In this case, the surface-coated cutting tool is preferably such that, in a direction of thickness of intermediate layer 111, a composition ratio of carbon contained in intermediate layer 111 continuously increases from a side of upper base layer 112 toward substrate 101 and attains to the maximum at the interface with substrate 101. Furthermore, desirably, a composition ratio of nitrogen contained in intermediate layer 111 continuously increases from a side of substrate 101 toward upper base layer 112 and attains to the maximum at the interface with upper base layer 112 in the direction of thickness of intermediate layer 111. Substrate 101 contains a carbide (WC) and upper base layer 112 contains a nitride (TiN or the like). Therefore, as the composition ratios of C and N vary as above in intermediate layer 111, chemical affinity for both of substrate 101 and upper base layer 112 is further improved. Such variation in composition ratio can be achieved, for example, by forming a film with a ratio of a flow rate between an N source gas and a C source gas being continuously varied in cathode arc ion plating which will be described later.

<Occupancy by WC Particles at Interface Between Substrate and Intermediate Layer>

An occupancy by WC particles on a substrate side of the interface where intermediate layer 111 and substrate 101 are in contact with each other is preferably not lower than 80% and more preferably not lower than 90%. As there is less soft binder phase (Co or the like) at the interface between intermediate layer 111 and substrate 101, adhesive force between intermediate layer 111 and substrate 101 is higher. Here, the occupancy essentially refers to an occupancy of an area at the interface, however, it is defined herein in a cross-section of a surface-coated cutting tool as follows. Namely, a surface-coated cutting tool is cut along a plane including a normal to the surface thereof, a reference line having a length of 3 µm is set in the interface (a width of three crystal grains) between intermediate layer 111 and substrate 101 in the obtained cut surface in observation thereof with an SEM at a magnification of 25000×, a total length of a portion on the reference line where intermediate layer 111 and WC particles are in contact with each other is measured, and the total length is divided by the length (3 µm) of the reference line. A percentage of this value is defined as the occupancy by the WC particles. A higher occupancy is preferred and it is ideally 100%. Taking into account productivity, however, the upper limit value thereof is, for example, approximately 99%.

<Method of Measuring Thickness of Intermediate Layer>

Intermediate layer 111 has a thickness not smaller than 3 nm and not greater than 10 nm as described above. The thickness of intermediate layer 111 refers to a shortest distance from the interface between substrate 101 and intermediate layer 111 to the interface between intermediate layer 111 and upper base layer 112. Therefore, a thickness of intermediate layer 111 can be measured by specifying each interface with a method below.

In the present embodiment, the interface between substrate 101 and intermediate layer 111 and the interface between intermediate layer 111 and upper base layer 112 can be specified by conducing analysis with low-angle annular dark-field scanning transmission electron microscopy (LAADF-STEM). A cross-sectional STEM image obtained in analysis with LAADF-STEM shows more brightly a region where atoms large in atomic number and strain are present. For example, in the cross-sectional STEM image shown in FIG. 2, a difference in atom of which the substrate and each layer are composed is reflected and the substrate and each layer appear at different brightness levels. Since strain is particularly concentrated in intermediate layer 111, the intermediate layer appears brightest in the present embodiment. Therefore, a portion where brightness abruptly changes, that is, a portion where a type of atoms of which the substrate and each layer are composed abruptly changes, can be specified as the interface.

Therefore, a thickness of intermediate layer 111 can be found in a manner below. Initially, the surface-coated cutting tool is cut as in measurement of a thickness of the coating film and the cut surface is polished. Thus, a piece which is 2.5 mm long×0.5 mm wide×0.1 mm thick and includes the substrate and the coating film is fabricated. The piece is machined to a thickness not greater than 50 nm with an ion slicer (a trade name: "IB-09060CIS" manufactured by JEOL Ltd.) to obtain a measurement sample. The measurement sample is analyzed with LAADF-STEM to obtain a cross-sectional STEM image as shown in FIG. 2. In the present embodiment, a STEM apparatus (a trade name: "JEM-2100F" manufactured by JEOL Ltd.) is used for analysis with LAADF-STEM under a condition of an acceleration voltage of 200 kV. The STEM apparatus incorporates a spherical aberration corrector (CESCOR manufactured by CEOS GmbH).

Figure 3:
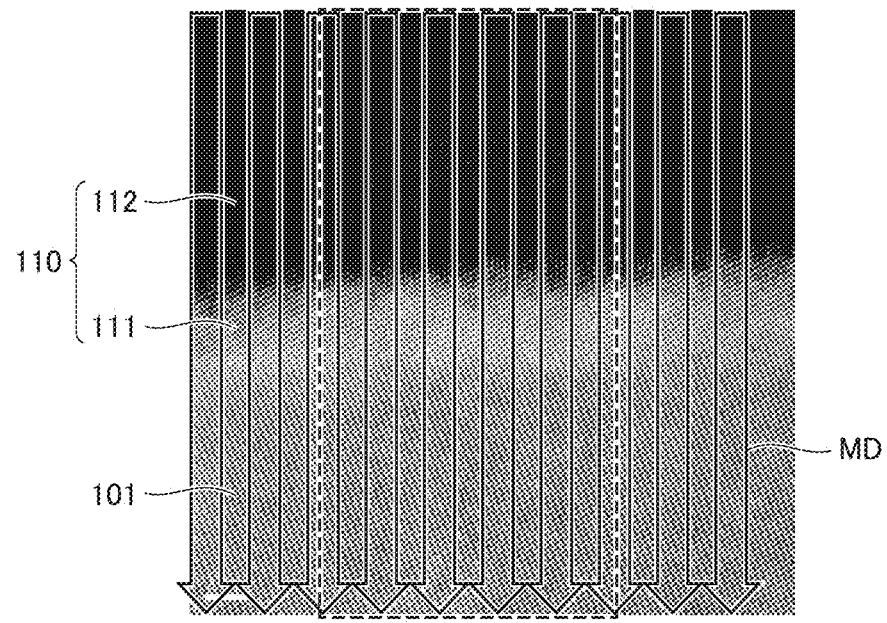
FIG. 3 illustrates a method of measuring a thickness of an intermediate layer, with arrows set in obtaining an LAADF intensity profile (2 nm×10 rows, the arrows showing a direction of measurement) being superimposed on the cross-sectional STEM image shown in FIG. 2.
Figure 4:
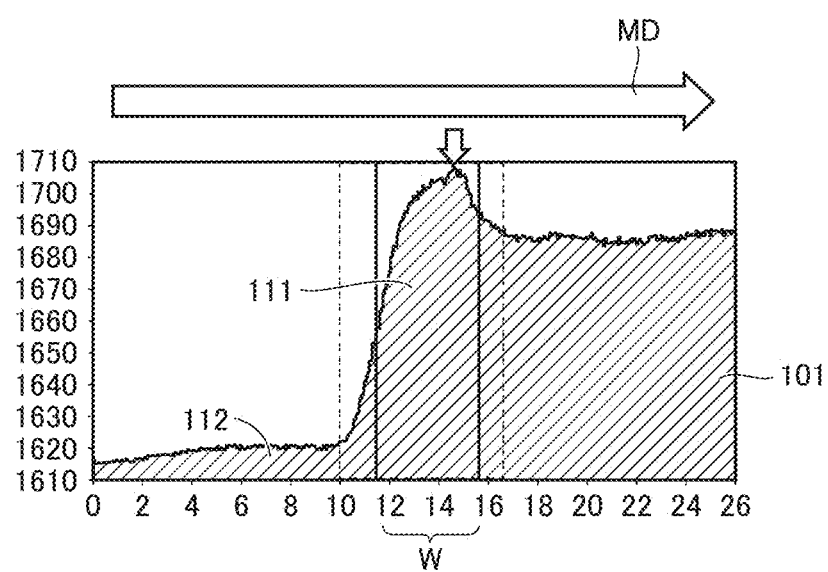
FIG. 4 illustrates a method of measuring a thickness of an intermediate layer with a graph showing an exemplary LAADF intensity profile obtained along one row of the plurality of arrows shown in FIG. 3.

As shown in FIG. 3, brightness of atoms and strain in the substrate and each layer is measured at a 2-nm pitch as an LAADF intensity profile along a direction of measurement MD from a side of upper base layer 112 toward substrate 101 in the cross-sectional STEM image. FIG. 4 shows a result of an intensity profile at a 2-nm pitch along direction of measurement MD (an intensity profile of one row of a plurality of arrows shown in FIG. 3). The intensity profile in FIG. 4 is shown as a line graph with the X axis (the abscissa) representing a distance from a point of start of measurement in upper base layer 112 and the Y axis (the ordinate) representing intensity (brightness of atoms).

As shown in FIG. 4, in the surface-coated cutting tool according to the present embodiment, a peak of the intensity profile (of which location is shown with a downward arrow in FIG. 4) appears in the intermediate layer. A flat portion on a side of substrate 101 and a flat portion in upper base layer 112 in the intensity profile appear around the peak. In contrast to these flat portions, a point of variation on the side of substrate 101 where a slope starts toward the peak in the intensity profile (an intersection with a vertical dashed line where a distance from the point of start of measurement in upper base layer 112 is shown as 16.4 nm) and a point of variation in upper base layer 112 (an intersection with a vertical dashed line where a distance from the point of start of measurement in upper base layer 112 is shown as 10 nm) also appear.

In the present embodiment, in the intensity profile as shown in FIG. 4, an X coordinate of a coordinate representing a median of intensity (brightness) between the peak and the point of variation on the side of substrate 101 where the slope starts toward the peak is defined as the interface between substrate 101 and intermediate layer 111. A vertical solid line where the distance from the point of start of measurement in upper base layer 112 is shown as 15.6 nm in FIG. 4 indicates the interface between substrate 101 and intermediate layer 111. Similarly, an X coordinate of a coordinate representing a median of intensity (brightness) between the peak and the point of variation in upper base layer 112 where the slope starts toward the peak is defined as the interface between intermediate layer 111 and upper base layer 112. A vertical solid line where the distance from the point of start of measurement in upper base layer 112 is shown as 11.4 nm in FIG. 4 indicates the interface between intermediate layer 111 and upper base layer 112. A distance W between the interfaces is regarded as a thickness of the intermediate layer (in FIG. 4, 15.6−11.4=4.2 (nm)).

In particular, in the present embodiment, intensity profiles of ten rows are obtained at the 2-nm pitch in direction of measurement MD in the cross-sectional STEM image as shown with the arrows shown in FIG. 3 and an average value of distances W among ten interfaces obtained from the intensity profiles of ten rows is defined as a thickness of the intermediate layer.

<Mismatch in Lattice Interplanar Spacing in Interface Region Between Substrate and Intermediate Layer>

In the surface-coated cutting tool according to the present embodiment, a mismatch in lattice interplanar spacing in the interface region between substrate 101 and intermediate layer 111 is not higher than 65% of a theoretical value of a mismatch in lattice interplanar spacing between substrate 101 and upper base layer 112. In the present embodiment, adhesiveness between substrate 101 and intermediate layer 111 is improved and hence adhesiveness between the substrate and the coating film can be improved by setting the mismatch in lattice interplanar spacing in the interface region between substrate 101 and intermediate layer 111 to be lower than the theoretical value of the mismatch in lattice interplanar spacing between substrate 101 and upper base layer 112.

When the mismatch in lattice interplanar spacing in the interface region between substrate 101 and intermediate layer 111 exceeds 65% of the theoretical value of the mismatch in lattice interplanar spacing between substrate 101 and upper base layer 112, an effect sufficient for adhesiveness is not obtained. A lower limit value of the mismatch in lattice interplanar spacing in the interface region between substrate 101 and intermediate layer 111 is 0% representing an ideal value.

The "mismatch in lattice interplanar spacing" herein refers to a probability of introduction of misfit dislocation without achievement of lattice match between crystal planes when prescribed crystal planes of one crystal and another crystal are continuously located at one interface. In general, when prescribed crystal planes of one crystal and another crystal are continuous, a lattice interplanar spacing between crystal planes of the crystals are different from each other and hence misfit dislocation is introduced at a certain ratio. The misfit dislocation thus refers to a defect caused at the time of occurrence of lattice mismatch between crystal planes of crystals. Therefore, the "mismatch in lattice interplanar spacing" can be defined as an indicator showing proneness of introduction of misfit dislocation. Since misfit dislocation produces dynamic strain energy, it is considered that adhesiveness between interfaces becomes lower as the number of misfit dislocations is greater. For example, when prescribed crystal planes of tungsten carbide (WC) and titanium nitride (TiN) are continuous to each other, a theoretical value of the mismatch in lattice interplanar spacing calculated from a difference in lattice interplanar spacing can be shown as in Table 1. In Table 1, a lattice interplanar spacing is expressed with a unit of angstrom (Å).

TABLE 1

| | WC | | TiN | | Mismatch in |
| --- | --- | --- | --- | --- | --- |
| Combination | Crystal Plane | Lattice Interplanar Spacing | Crystal Plane | Lattice Interplanar Spacing | Lattice Interplanar Spacing |
| a | (0001) | 2.840 | (111) | 2.449 | 13.8% |
| b | (10-10) | 2.518 | (111) | 2.449 | 2.7% |
| c | (10-11) | 1.884 | (111) | 2.449 | 30.0% |
| d | (0001) | 2.840 | (002) | 2.121 | 25.3% |
| e | (10-10) | 2.518 | (002) | 2.121 | 15.8% |
| f | (10-11) | 1.884 | (002) | 2.121 | 12.6% |
| g | (0001) | 2.840 | (220) | 1.500 | 47.2% |
| h | (10-10) | 2.518 | (220) | 1.500 | 40.4% |
| i | (10-11) | 1.884 | (220) | 1.500 | 20.4% |

In Table 1, for example, when the (0001) plane of WC and the (111) plane of TiN are continuous as in a combination a, lattice interplanar spacings are 2.840 and 2.449 and misfit dislocation is introduced at a probability of 13.8% as a theoretical value. In the present embodiment, however, a combination of crystal planes of tungsten carbide (WC) and titanium nitride (TiN) should not be limited to those shown in Table 1. Since the crystal structure is symmetric, a combination of equivalent crystal planes not shown in Table 1 is also encompassed in the present embodiment. An "interface region" herein will be defined later.

<Mismatch in Lattice Interplanar Spacing in Interface Region Between Intermediate Layer and Upper Base Layer>

In the surface-coated cutting tool according to the present embodiment, a mismatch in lattice interplanar spacing in the interface region between intermediate layer 111 and upper base layer 112 is not higher than 65% of the theoretical value of the mismatch in lattice interplanar spacing between substrate 101 and upper base layer 112. In the present embodiment, adhesiveness between intermediate layer 111 and upper base layer 112 can be improved and hence adhesiveness between the substrate and the coating film can be improved by setting the mismatch in lattice interplanar spacing in the interface region between intermediate layer 111 and upper base layer 112 to be significantly lower than the theoretical value of the mismatch in lattice interplanar spacing between substrate 101 and upper base layer 112.

When the mismatch in lattice interplanar spacing in the interface region between intermediate layer 111 and upper base layer 112 exceeds 65% of the theoretical value of the mismatch in lattice interplanar spacing between substrate 101 and upper base layer 112, an effect sufficient for adhesiveness is not obtained. The lower limit value of the mismatch in lattice interplanar spacing in the interface region between intermediate layer 111 and upper base layer 112 is 0% representing an ideal value.

<Method of Measuring Mismatch in Lattice Interplanar Spacing>

A method of measuring a mismatch in lattice interplanar spacing in the interface region between substrate 101 and intermediate layer 111 and the interface region between intermediate layer 111 and upper base layer 112 will be described below.

Figure 5:
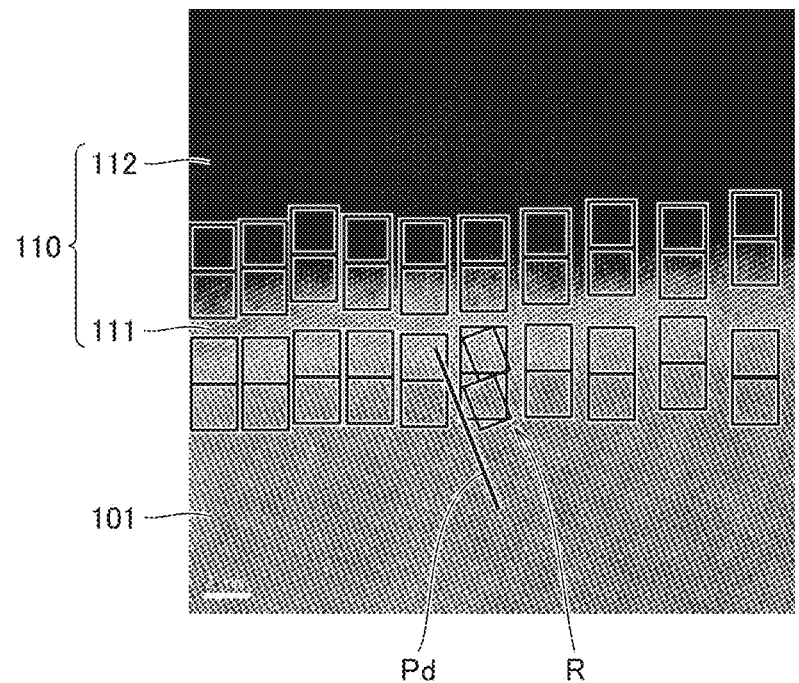
FIG. 5 illustrates a method of measuring a mismatch in lattice interplanar spacing, with an interface at which an LAADF intensity profile (a portion of joint between two adjacent quadrangles) is obtained and an orientation of measurement being superimposed on the cross-sectional STEM image shown in FIG. 2.

Initially, a cross-sectional STEM image is obtained with LAADF-STEM and an LAADF intensity profile of the substrate and each layer is obtained along a prescribed direction of measurement MD (see FIG. 3) with a method the same as the method of measuring a thickness of the intermediate layer described above. The interface between substrate 101 and intermediate layer 111 and the interface between intermediate layer 111 and upper base layer 112 are specified based on an intensity profile with a method the same as the method of measuring a thickness of the intermediate layer described above. FIG. 5 shows an interface specified in the cross-sectional STEM image. In FIG. 5, a portion of joint between two quadrangles adjacent in a direction downward from above shows the interface between substrate 101 and intermediate layer 111 or the interface between intermediate layer 111 and upper base layer 112.

A fast Fourier transform (FFT) image of each crystal region is obtained by subjecting the cross-sectional STEM image in FIG. 5 to FFT, and a crystal structure and a plane orientation of crystals which form substrate 101, intermediate layer 111, and upper base layer 112 are obtained based on the FFT image. A combination of plane orientations which is smallest in angle (gap) between planes among combinations of a plane orientation of crystals which form substrate 101 and a plane orientation of crystals which form intermediate layer 111 in the cross-sectional STEM image is selected as an orientation of measurement Pd. Similarly, a combination of plane orientations smallest in gap also among combinations of a plane orientation of crystals which form intermediate layer 111 and a plane orientation of crystals which form upper base layer 112 is selected as orientation of measurement Pd.

A method of selecting orientation of measurement Pd will be described with reference to the example in FIG. 5. In a specific example, a region of WC and a region of TiN in the cross-sectional STEM image in FIG. 5 are subjected to fast Fourier transform processing to thereby obtain FFT images of the WC region and the TiN region and orientation of measurement Pd is selected based on the plane orientations obtained based on the FFT images. In this case, crystals of WC and TiN in the cross-sectional STEM image have plane orientations shown in Table 2 below, respectively. In Table 2, a angle (gap) is smallest (0.0°) in a combination of the (10-10) plane of WC and the (111) plane of TiN, and therefore the plane orientation in this combination is selected as orientation of measurement Pd.

TABLE 2

|  | WC (10-10) Plane | WC (0001) Plane |
| --- | --- | --- |
| TiN (111) Plane | 0.0° | 90.0° |
| TiN (-1-11) Plane | 68.6° | 21.2° |
| TiN (002) Plane | 56.4° | 35.3° |

Then, an LAADF intensity profile is obtained on each of the side of substrate 101 and the side of intermediate layer 111 at the interface between substrate 101 and intermediate layer 111 along orientation of measurement Pd selected as described above. Similarly, an LAADF intensity profile is obtained on each of the side of intermediate layer 111 and upper base layer 112 at the interface between intermediate layer 111 and upper base layer 112. A measurement region R of interest of the LAADF intensity profile covers an area having a lateral width (a measurement width) of 1.5 nm and a length (a measurement length L) of 2 nm. In FIG. 5, measurement region R is shown with two inclined quadrangles adjacent in the direction downward from above. Measurement region R refers to a region defined as the "interface region" herein.

Figure 6:
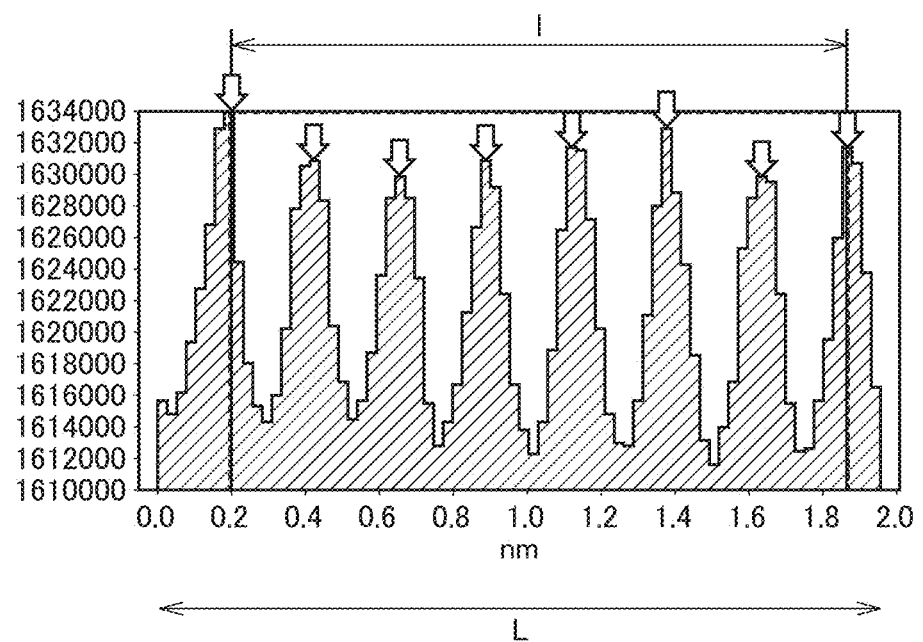
FIG. 6 illustrates a method of measuring a mismatch in lattice interplanar spacing with a graph showing one exemplary LAADF intensity profile obtained at one of the plurality of interfaces shown in FIG. 5.

As shown in FIG. 6, in the surface-coated cutting tool according to the present embodiment, a plurality of (eight in FIG. 6) periodic peak tops (shown with downward arrows in FIG. 6) appear over measurement length L (2 nm) as the intensity profile in one measurement region R. A plurality of (seven in FIG. 6) sections corresponding to valleys between peak tops also appear. In the present embodiment, a numeric value (an average value per one period) obtained with the number of sections (seven) which appear in the intensity profile being defined as a denominator and a length l between a plurality of (eight) peak tops being defined as a numerator is regarded as a lattice interplanar spacing between crystals in measurement region R.

From the foregoing, in the present embodiment, a lattice interplanar spacing in orientation of measurement Pd of crystals which form substrate 101 in measurement region R and a lattice interplanar spacing in orientation of measurement Pd of crystals which form intermediate layer 111 in measurement region R can be specified. Therefore, a mismatch in lattice interplanar spacing in the interface region between substrate 101 and intermediate layer 111 can be calculated by performing calculation in accordance with a calculation formula below for finding a mismatch in lattice interplanar spacing in the interface region between substrate 101 and intermediate layer 111 based on a difference between two lattice interplanar spacings obtained here. In the calculation formula below, a mismatch in lattice interplanar spacing is always expressed with a positive number as an absolute value.

> Mismatch in lattice interplanar spacing (%) in interface region between substrate and intermediate layer=100×{(lattice interplanar spacing in intermediate layer on substrate side)−(lattice interplanar spacing in substrate)}/(lattice interplanar spacing in substrate)

Similarly, a lattice interplanar spacing in orientation of measurement Pd of crystals which form intermediate layer 111 in measurement region R and a lattice interplanar spacing in orientation of measurement Pd of crystals which form upper base layer 112 in measurement region R can be specified. Therefore, a mismatch in lattice interplanar spacing in the interface region between intermediate layer 111 and upper base layer 112 can be calculated by performing calculation in accordance with a calculation formula below for finding a mismatch in lattice interplanar spacing in the interface region between intermediate layer 111 and upper base layer 112 based on a difference between two lattice interplanar spacings obtained here. In the calculation formula below as well, a mismatch in lattice interplanar spacing is always expressed with a positive number as an absolute value.

> Mismatch in lattice interplanar spacing (%) in interface region between intermediate layer and upper base layer=100×{(lattice interplanar spacing in upper base layer)−(lattice interplanar spacing in intermediate layer on upper base layer side)}/(lattice interplanar spacing in intermediate layer on upper base layer side)

In particular, in the present embodiment, as shown in FIG. 5, ten measurement regions R are set on each of the side of substrate 101 and the side of intermediate layer 111 (twenty in total) in the interface between substrate 101 and intermediate layer 111 in one cross-sectional STEM image. Therefore, LAADF intensity profiles similar to the above of twenty measurement regions R in total are obtained and ten (ten sets of) mismatches in lattice interplanar spacing are obtained based on the LAADF intensity profiles. Therefore, an average value thereof is defined as a mismatch in lattice interplanar spacing in the interface region between substrate 101 and intermediate layer 111. Similarly, ten measurement regions R are set on each of the side of intermediate layer 111 and the side of upper base layer 112 (twenty in total) in the interface between intermediate layer 111 and upper base layer 112 in one cross-sectional STEM image. Therefore, LAADF intensity profiles similar to the above of twenty measurement regions R in total are obtained and ten (ten sets of) mismatches in lattice interplanar spacing are obtained based on the LAADF intensity profiles. Therefore, an average value thereof is defined as a mismatch in lattice interplanar spacing in the interface region between intermediate layer 111 and upper base layer 112.

In the present embodiment, WC—Co based cemented carbide of which the substrate is composed is manufactured through liquid-phase sintering. Therefore, plane orientations of crystals of WC particles at the surface of the substrate are random. Therefore, in the present embodiment, a mismatch in lattice interplanar spacing in each interface region is calculated with the method described above also for another cross-sectional STEM image (which is referred to as a "second field of view" for the sake of convenience) and yet another cross-sectional STEM image (which is referred to as a "third field of view" for the sake of convenience) in addition to the cross-sectional STEM image described above (which is referred to as a "first field of view" for the sake of convenience). Another cross-sectional STEM image (the second field of view) adopts a combination of plane orientations different from orientation of measurement Pd in the cross-sectional STEM image in the first field of view as orientation of measurement Pd. Yet another cross-sectional STEM image (the third field of view) adopts a combination of plane orientations different from the cross-sectional STEM images of both of the first and second fields of view as orientation of measurement Pd. In the present embodiment, an average value of the mismatches in lattice interplanar spacing in three orientations of measurement Pd is defined as a mismatch in lattice interplanar spacing in each of the interface region between substrate 101 and intermediate layer 111 and the interface region between intermediate layer 111 and upper base layer 112.

A mismatch in lattice interplanar spacing in the interface region between substrate 101 and intermediate layer 111 and a mismatch in lattice interplanar spacing in the interface region between intermediate layer 111 and upper base layer 112 are obtained as above. In the present embodiment, when the mismatch in lattice interplanar spacing in the interface region between substrate 101 and intermediate layer 111 obtained with the method described above is compared with a theoretical value of the mismatch in lattice interplanar spacing between substrate 101 and upper base layer 112, it is not higher than 65% of the theoretical value. When the mismatch in lattice interplanar spacing in the interface region between intermediate layer 111 and upper base layer 112 obtained with the method described above is compared with the theoretical value of the mismatch in lattice interplanar spacing between substrate 101 and upper base layer 112, it is not higher than 65% of the theoretical value.

<Function>

As set forth above, the surface-coated cutting tool according to the present embodiment can be excellent in adhesiveness between the substrate and the coating film and can withstand also a severe cutting condition.

<<Method of Manufacturing Surface-Coated Cutting Tool>>

Though a method of manufacturing a surface-coated cutting tool according to the present embodiment should not particularly be restricted so long as the surface-coated cutting tool described above can be manufactured, manufacturing, for example, with the following method is preferred. The method of manufacturing a surface-coated cutting tool can include, for example, the steps of preparing a substrate and forming a coating film. The step of forming a coating film includes the steps of treating a surface of the substrate, forming an intermediate layer, and forming an upper base layer and an upper layer other than the upper base layer. Each step will be described below.

<Step of Preparing Substrate>

In the step of preparing a substrate, a substrate containing WC particles having a hexagonal crystal system and a binder phase containing Co and binding the WC particles to one another is prepared. Such a substrate made of WC—Co based cemented carbide can be prepared with conventionally known powder metallurgy. WC—Co based cemented carbide (sintered material) is obtained, for example, by obtaining mixed powders by mixing WC powders and Co powders in a ball mill followed by drying, obtaining a formed object by forming the dried mixed powders in a prescribed shape, and then sintering the formed object. Then, the substrate made of WC—Co based cemented carbide can be prepared by subjecting the sintered material to prescribed cutting edge working such as honing.

<Step of Forming Coating Film>

The coating film should withstand a high temperature during cutting of a difficult-to-cut material. Therefore, the coating film is desirably composed of a compound high in crystallinity. As a result of review by the present inventor of various techniques for film formation in order to develop such a coating film, it has been found that physical vapor deposition (PVD) is preferred. Physical vapor deposition refers to a vapor deposition method in which a source material (an evaporation source, also referred to as a target) is vaporized by making use of a physical action and the vaporized source material adheres onto a substrate. Such a physical vapor deposition method includes, for example, cathode arc ion plating, balanced magnetron sputtering, and unbalanced magnetron sputtering.

Among these physical vapor deposition methods, cathode arc ion plating is suitable for manufacturing a coating film of the surface-coated cutting tool according to the present embodiment because it is high in ratio of ionization of source materials. By adopting cathode arc ion plating, the substrate can be cleaned through ion bombardment treatment which will be described later in the same film formation apparatus, which can contribute to simplification of a manufacturing process and improvement in productivity.

(Step of Treating Surface of Substrate)

In the present embodiment, before the step of forming an intermediate layer, at least a part of the binder phase exposed at the surface of the substrate can be removed through ion bombardment treatment using Ar ions as the step of treating a surface of the substrate. The surface of the substrate can be cleaned and an occupancy by the WC particles at the surface can thus be enhanced. Then, by adhering one or more elements selected from Ti, Cr, Al, and Si to the surface of the substrate in the next step of forming an intermediate layer, these elements and the WC particles tend to firmly be bound to each other and a function of adhesion of the intermediate layer to the substrate can further be improved. The occupancy by the WC particles can be adjusted, for example, based on a time period for ion bombardment treatment.

(Step of Forming Intermediate Layer)

In the step of forming an intermediate layer, combined treatment of cathode arc ion plating using a target composed of an element for forming a part of the intermediate layer (for example, a target of at least one selected from among W, Ti, Cr, Al, and Si) together with ion bombardment treatment with Ar ions is performed. The intermediate layer can be formed by depositing a prescribed compound in a nitrogen or methane atmosphere with ion mixing on a surface of a WC particle by applying a bias voltage at 100 kHz and 1000 V and cathode arc ion plating using a target composed of an element for forming a part of the intermediate layer (for example, a target of at least one selected from among W, Ti, Cr, Al, and Si). A thickness of the intermediate layer can be adjusted based on a time period for the combined treatment and a bias voltage and a time period for deposition of an element.

(Step of Forming Upper Base Layer and Upper Layer Other than Upper Base Layer)

Thereafter, the upper base layer can be formed by successively depositing an element (for example, Ti) which forms the upper base layer on the intermediate layer in a nitrogen or methane gas atmosphere with cathode arc ion plating. When the upper layer is made up of multiple layers constituted of two or more layers including the upper base layer, the upper layer other than the upper base layer can be formed by successively depositing an element (for example, Ti and Al) which forms the upper layer on the upper base layer in the nitrogen or methane gas atmosphere with cathode arc ion plating.

After the upper base layer and the upper layer are formed, compressive residual stress can be provided to the coating film for improving toughness of the coating film. Compressive residual stress can be provided, for example, with blasting, brushing, barreling, and ion implantation.

The surface-coated cutting tool according to the present embodiment can readily be manufactured through the steps above.

EXAMPLES

Though the present embodiment will be described hereinafter in further detail with reference to Examples, the present embodiment is not limited thereto.

<Manufacturing of Samples 1 to 7 and Samples 101 to 105>

Surface-coated cutting tools (samples 1 to 7 and samples 101 to 105) were manufactured as below, and a cutting test was conducted to evaluate a lifetime of the tool. Here, samples 1 to 7 correspond to Examples and samples 101 to 105 correspond to Comparative Examples.

<Step of Preparing Substrate>

Initially, a drill of φ 8 mm made of cemented carbide of which material was "ISO K10 grade" (a trade name (a model number): "MDW0800HGS5" manufactured by Sumitomo Electric Hardmetal Corporation) was prepared as a substrate. This substrate made of cemented carbide contains WC particles and a binder phase containing Co and binding the WC particles to one another.

<Step of Forming Coating Film>

A coating film was formed on a surface of the above-described substrate with a PVD film formation apparatus (a cathode arc ion plating apparatus).

Initially, the substrate was set on a substrate holder in the apparatus. Then, a pressure in a chamber was reduced to $1.0 \times 10^{-4}$ Pa with a vacuum pump. Furthermore, while the substrate holder was turned, the substrate was heated to 500° C. with a heater provided in the apparatus.

(Step of Treating Surface of Substrate)

An Ar gas was introduced through a gas introduction port of the apparatus, a voltage of a bias power supply was increased to 600 V while the pressure in the chamber was held at 0.5 Pa, and the surface of the substrate was cleaned through ion bombardment treatment using Ar ions for sixty minutes. The binder phase exposed at the surface of the substrate was thus removed.

(Step of Forming Intermediate Layer)

In succession to the step of treating the surface of the substrate, Ar was introduced from the gas introduction port, the pressure in the chamber was held at 1.3 Pa, and a voltage of the bias power supply was set to 100 kHz and 1000 V. Simultaneously, an ark current at 150 A was applied to an arc evaporation source (a Ti target) in the apparatus and the surface of the substrate was subjected to cathode arc ion plating with Ti ions. Ion mixing of WC and Ti was thus performed. The intermediate layer was thus formed.

As is understood in Tables 3 and 4 shown below, no intermediate layer was formed in samples 101 to 103 and these samples did not undergo the present step. A thickness of the intermediate layer was adjusted based on a time period during which the step of forming an intermediate layer was performed. For example, it took three minutes to form an intermediate layer having a thickness of 3 nm in sample 1 based on the present step.

(Step of Forming Upper Base Layer and Upper Layer Other than Upper Base Layer)

In succession to the step of forming an intermediate layer, the upper base layer was formed. Specifically, a nitrogen gas was introduced from the gas introduction port of the apparatus into the chamber, the pressure in the chamber was held at 6.0 Pa, and a voltage of the bias power supply was set to 30 V. An arc current at 120 A was applied to a Ti target set on the arc evaporation source in the apparatus, and the upper base layer was formed by depositing TiN on the substrate on which the intermediate layer had been formed. A time period for treatment in the present step was set to three minutes.

In succession to formation of the upper base layer, an upper layer other than the upper base layer was formed. Specifically, the nitrogen gas was successively introduced into the chamber, the pressure was held at 6.0 Pa, and a voltage of the bias power supply was set to 50 V. The upper layer other than the upper base layer was formed by setting a TiAl target on the arc evaporation source in the apparatus and depositing TiAlN on the substrate on which the upper base layer had been formed by applying an arc current at 150 A to the target. A time period for treatment in the present step was set to 120 minutes.

<Evaluation of Coating Film>

It was confirmed in observation of a cross-sectional STEM image of a cut surface prepared by cutting each sample that the substrate of each sample had a hexagonal crystal system (denoted as "hexagonal" in the tables) and the intermediate layer (except for samples 101 to 103) and the upper base layer (TiN layer) had an NaCl crystal structure (denoted as "NaCl" in the tables). A composition of each sample was determined through TEM-EDX analysis of the cut surface, and it was confirmed that the substrate was composed of WC. It was also confirmed that the intermediate layer was composed of elements which formed the substrate (W and C) and Ti and N. It was also further confirmed that the upper base layer was the TiN layer.

A thickness of the intermediate layer was found with the measurement method described above based on the cross-sectional STEM image. A mismatch in lattice interplanar spacing in the interface region between the substrate and the intermediate layer and a mismatch in lattice interplanar spacing in the interface region between the intermediate layer and the TiN layer were found with the measurement method described above for the samples including the intermediate layer. A difference of a mismatch in lattice interplanar spacing from a theoretical value (A: a ratio of decrease from the theoretical value of the mismatch in lattice interplanar spacing being represented in a unit of %) was also found. A mismatch in lattice interplanar spacing of the samples (samples 101 to 103) was found by applying the measurement method described above to the interface region between the substrate and the TiN layer. Tables 3 and 4 show results.

A combination of plane orientations of sample 1 was combinations a, b, and e in Table 1 described above, a combination of plane orientations of samples 2 to 5 and samples 102, 104, and 105 was combinations a, e, and f in Table 1, a combination of plane orientations of sample 6 and sample 103 was combinations b, e, and f in Table 1, and a combination of plane orientations of sample 7 was combinations a, b, and f in Table 1.

Tables 3 and 4 show also a crystal structure of the substrate (WC), the intermediate layer, and the upper base layer (TiN) of each sample as well as a combination (orientation of measurement) of plane orientations determined based on the cross-sectional STEM image (first to third fields of view) and a lattice interplanar spacing measured along the orientation of measurement. For the samples (samples 101 to 103) without the intermediate layer, a crystal structure of the substrate (WC) and the upper base layer (TiN) as well as a combination (orientation of measurement) of plane orientations determined based on the cross-sectional STEM image (the first to third fields of view) and a lattice interplanar spacing measured along the orientation of measurement thereof are shown. Though the lattice interplanar spacing shown in Tables 3 and 4 may be different in value from the lattice interplanar spacing shown in Table 1, this is caused by an error between a calculated theoretical value and a measured value resulting from actual measurement. A measured value and A are shown to one place of decimals by rounding off the number to one decimal place.

TABLE 3

| | | Substrate (WC) | | | Intermediate Layer | | | | |
|---|---|---|---|---|---|---|---|---|---|
| | | | | | | | | Spacing on Upper Base Side [Å] | Upper Base Layer (TiN) |
| Sample No. | | Crystal Structure | Crystal Plane | Spacing [Å] | Thickness [nm] | Crystal Structure | Plane Orientation | Spacing on Substrate Side [Å] | Crystal Structure |
| Sample 1 | First Field of View | Hexagonal | (10-10) | 2.50 | 3 | NaCl | (002) | 2.31 | 2.09 | NaCl |
| | Second Field of View | Hexagonal | (0001) | 2.77 | 3 | NaCl | (111) | 2.58 | 2.44 | NaCl |
| | Third Field of View | Hexagonal | (10-10) | 2.50 | 3 | NaCl | (111) | 2.37 | 2.40 | NaCl |
| | Average | — | — | — | 3 | — | — | — | — | — |
| Sample 2 | First Field of View | Hexagonal | (0001) | 2.78 | 10 | NaCl | (111) | 2.55 | 2.44 | NaCl |
| | Second Field of View | Hexagonal | (10-11) | 1.87 | 10 | NaCl | (002) | 1.72 | 2.10 | NaCl |
| | Third Field of View | Hexagonal | (10-10) | 2.49 | 10 | NaCl | (002) | 2.27 | 2.11 | NaCl |
| | Average | — | — | — | 10 | — | — | — | — | — |
| Sample 3 | First Field of View | Hexagonal | (0001) | 2.78 | 8 | NaCl | (111) | 2.55 | 2.44 | NaCl |
| | Second Field of View | Hexagonal | (10-11) | 1.87 | 8 | NaCl | (111) | 1.72 | 2.10 | NaCl |
| | Third Field of View | Hexagonal | (10-10) | 2.49 | 8 | NaCl | (002) | 2.27 | 2.11 | NaCl |
| | Average | — | — | — | 8 | — | — | — | — | — |
| Sample 4 | First Field of View | Hexagonal | (0001) | 2.78 | 5 | NaCl | (111) | 2.55 | 2.44 | NaCl |
| | Second Field of View | Hexagonal | (10-11) | 1.87 | 5 | NaCl | (111) | 1.72 | 2.10 | NaCl |
| | Third Field of View | Hexagonal | (10-10) | 2.49 | 5 | NaCl | (002) | 2.27 | 2.11 | NaCl |
| | Average | — | — | — | 5 | — | — | — | — | — |

TABLE 3-continued

| | | | | | | | | | | |
|---|---|---|---|---|---|---|---|---|---|---|
| Sample 5 | First Field of View | Hexagonal | (0001) | 2.78 | 3 | NaCl | (111) | 2.55 | 2.44 | NaCl |
| | Second Field of View | Hexagonal | (10-11) | 1.87 | 3 | NaCl | (111) | 1.72 | 2.10 | NaCl |
| | Third Field of View | Hexagonal | (10-10) | 2.49 | 3 | NaCl | (002) | 2.27 | 2.11 | NaCl |
| | Average | — | — | — | 3 | — | — | — | — | — |
| Sample 6 | First Field of View | Hexagonal | (10-10) | 2.50 | 3 | NaCl | (111) | 2.40 | 2.41 | NaCl |
| | Second Field of View | Hexagonal | (10-10) | 2.50 | 3 | NaCl | (002) | 2.27 | 2.11 | NaCl |
| | Third Field of View | Hexagonal | (10-11) | 1.86 | 3 | NaCl | (002) | 1.76 | 2.11 | NaCl |
| | Average | — | — | — | 3 | — | — | — | — | — |
| Sample 7 | First Field of View | Hexagonal | (0001) | 2.78 | 3 | NaCl | (111) | 2.52 | 2.43 | NaCl |
| | Second Field of View | Hexagonal | (10-10) | 2.50 | 3 | NaCl | (111) | 2.42 | 2.43 | NaCl |
| | Third Field of View | Hexagonal | (10-11) | 1.86 | 3 | NaCl | (002) | 1.75 | 2.11 | NaCl |
| | Average | — | — | — | 3 | — | — | — | — | — |

| | | Upper Base Layer (TiN) | | Mismatch in Lattice Interplanar Spacing | | | | | |
|---|---|---|---|---|---|---|---|---|---|
| | | | | Substrate/Upper Layer (TiN) | | Substrate/Intermediate Layer | | Intermediate Layer/Upper Layer (TiN) | |
| Sample No. | | Plane Orientation | Spacing [Å] | Theoretical Value | Measured Value | Δ | Measured Value | Δ | |
| Sample 1 | First Field of View | (002) | 2.10 | 15.8% | 7.6% | 48.1% | 0.5% | 3.0% | |
| | Second Field of View | (111) | 2.44 | 13.8% | 6.9% | 50.0% | 0.0% | 0.0% | |
| | Third Field of View | (111) | 2.43 | 2.7% | 5.2% | 193.0% | 1.3% | 48.1% | |
| | Average | — | — | 10.8% | 6.6% | 61.1% | 0.6% | 5.6% | |
| Sample 2 | First Field of View | (111) | 2.44 | 13.8% | 8.3% | 60.1% | 0.0% | 0.0% | |
| | Second Field of View | (002) | 2.11 | 12.6% | 8.0% | 63.5% | 0.5% | 4.0% | |
| | Third Field of View | (002) | 2.11 | 15.8% | 8.8% | 55.7% | 0.0% | 0.0% | |
| | Average | — | — | 14.0% | 8.4% | 60.0% | 0.2% | 1.4% | |
| Sample 3 | First Field of View | (111) | 2.44 | 13.8% | 8.3% | 60.1% | 0.0% | 0.0% | |
| | Second Field of View | (002) | 2.11 | 12.6% | 8.0% | 63.5% | 0.5% | 4.0% | |
| | Third Field of View | (002) | 2.11 | 15.8% | 8.8% | 55.7% | 0.0% | 0.0% | |
| | Average | — | — | 14.0% | 8.4% | 60.0% | 0.2% | 1.4% | |
| Sample 4 | First Field of View | (111) | 2.44 | 13.8% | 8.3% | 60.1% | 0.0% | 0.0% | |
| | Second Field of View | (002) | 2.11 | 12.6% | 8.0% | 63.5% | 0.5% | 4.0% | |
| | Third Field of View | (002) | 2.11 | 15.8% | 8.8% | 55.7% | 0.0% | 0.0% | |
| | Average | — | — | 14.0% | 8.4% | 60.0% | 0.2% | 1.4% | |
| Sample 5 | First Field of View | (111) | 2.44 | 13.8% | 8.3% | 60.1% | 0.0% | 0.0% | |
| | Second Field of View | (002) | 2.11 | 12.6% | 8.0% | 63.5% | 0.5% | 4.0% | |
| | Third Field of View | (002) | 2.11 | 15.8% | 8.8% | 55.7% | 0.0% | 0.0% | |
| | Average | — | — | 14.0% | 8.4% | 60.0% | 0.2% | 1.4% | |
| Sample 6 | First Field of View | (111) | 2.43 | 2.7% | 4.0% | 148.1% | 0.8% | 29.6% | |
| | Second Field of View | (002) | 2.11 | 15.8% | 9.2% | 58.2% | 0.0% | 0.0% | |
| | Third Field of View | (002) | 2.11 | 12.6% | 5.4% | 42.9% | 0.0% | 0.0% | |
| | Average | — | — | 10.4% | 6.2% | 59.6% | 0.3% | 2.9% | |
| Sample 7 | First Field of View | (111) | 2.43 | 13.8% | 9.4% | 68.1% | 0.0% | 0.0% | |
| | Second Field of View | (111) | 2.43 | 2.7% | 3.2% | 118.5% | 0.0% | 0.0% | |
| | Third Field of View | (002) | 2.11 | 12.6% | 5.9% | 46.8% | 0.0% | 0.0% | |
| | Average | — | — | 9.7% | 6.2% | 63.9% | 0.0% | 0.0% | |

TABLE 4

| Sample No. | Substrate (WC) Crystal Structure | Crystal Plane | Spacing [Å] | Intermediate Layer Thickness [nm] | Crystal Structure | Plane Orientation | Spacing on Substrate Side [Å] | Spacing on TiN Layer Side [Å] | Upper Base Layer (TiN) Crystal Structure |
|---|---|---|---|---|---|---|---|---|---|
| Sample 101 First Field of View | Hexagonal | (10-11) | 1.88 | — | — | — | — | — | NaCl |
| Second Field of View | Hexagonal | (0001) | 2.83 | — | — | — | — | — | NaCl |
| Third Field of View | Hexagonal | (10-10) | 2.51 | — | — | — | — | — | NaCl |
| Average | — | — | — | — | — | — | — | — | — |
| Sample 102 Average | Hexagonal | — | — | — | — | — | — | — | NaCl |
| Sample 103 Average | Hexagonal | — | — | — | — | — | — | — | NaCl |
| Sample 104 Average | Hexagonal | — | — | 20 | NaCl | — | — | — | NaCl |
| Sample 105 Average | Hexagonal | — | — | 1 | NaCl | — | — | — | NaCl |

| Sample No. | Upper Base Layer (TiN) Plane Orientation | Spacing [Å] | Substrate/Upper Layer (TiN) Theoretical Value | Substrate/Intermediate Layer Measured Value | Δ | Intermediate Layer/Upper Layer (TiN) Measured Value | Δ |
|---|---|---|---|---|---|---|---|
| Sample 101 First Field of View | (002) | 2.11 | 12.6% | | | 12.2% | |
| Second Field of View | (111) | 2.44 | 13.8% | | | 13.8% | |
| Third Field of View | (111) | 2.44 | 2.7% | | | 2.8% | |
| Average | — | — | 9.7% | | | 9.6% | |
| Sample 102 Average | — | — | 14.0% | | | 13.9% | |
| Sample 103 Average | — | — | 10.4% | | | 10.4% | |
| Sample 104 Average | — | — | 14.0% | 8.5% | 60.7% | 0.3% | 2.14% |
| Sample 105 Average | — | — | 14.0% | 8.5% | 60.7% | 5.5% | 39.2% |

<Evaluation of Lifetime of Tool>

A drill was manufactured as a cutting tool based on each sample fabricated as above and a lifetime of the tool was evaluated by conducting a cutting test on the drill of each sample. Cutting conditions were set as follows and the number of man-hours (the number of holes) until the lifetime of the tool expired was counted. Table 5 shows results. A greater number of holes in Table 5 represents a longer lifetime of the tool.

(Condition for Cutting)

Work material: carbon steel (S50C [HB200])

Cutting speed: 80 m/min.

Feed rate: 0.15 mm/blade

Working: to provide a through hole having a depth of 40 mm with supply of oil to the inside A lifetime of the tool was evaluated based on the number of successfully worked holes at a time point when dimension accuracy of a work material was out of a defined range (a hole diameter from 8.000 to 8.036 mm).

TABLE 5

| No. | The Number of Holes |
|---|---|
| Sample 1 | 900 |
| Sample 2 | 600 |
| Sample 3 | 600 |
| Sample 4 | 700 |
| Sample 5 | 800 |
| Sample 6 | 900 |
| Sample 7 | 1000 |
| Sample 101 | 100 |
| Sample 102 | 200 |
| Sample 103 | 200 |
| Sample 104 | 300 |
| Sample 105 | 300 |

(Evaluation)

Tables 3 to 5 show that the surface-coated cutting tools (samples 1 to 7) in Examples exhibited a longer lifetime in a stable manner than the surface-coated cutting tools (samples 101 to 105) in Comparative Examples.

The reason why such a result was obtained may be because adhesiveness between the coating film and the substrate was improved and peeling of the coating film was suppressed owing to a mismatch in lattice interplanar spacing being lower than the theoretical value in the interface region between the substrate and the intermediate layer and the interface region between the intermediate layer and the TiN layer under the presence of a prescribed intermediate layer. It was found that the intermediate layer should have a thickness not smaller than 3 nm and not greater than 10 nm and a stable long lifetime was noticeably exhibited particularly when the intermediate layer had a thickness not smaller than 3 nm and not greater than 5 nm.

Though the embodiment and the examples of the present invention have been described above, combination of features in each embodiment and example described above as appropriate is also originally intended.

It should be understood that the embodiment disclosed herein is illustrative and non-restrictive in every respect. The scope of the present invention is defined by the terms of the claims rather than the embodiment above and is intended to include any modifications within the scope and meaning equivalent to the terms of the claims.

REFERENCE SIGNS LIST

101 substrate; 110 coating film; 111 intermediate layer; 112 upper base layer; MD direction of measurement; Pd orientation of measurement; W distance between interfaces (thickness of intermediate layer); R measurement region (interface region); 1 length between peak tops; and L measurement length

The invention claimed is:

1. A surface-coated cutting tool comprising:
a substrate composed of cemented carbide; and
a coating film formed on the substrate,
the coating film including an intermediate layer in contact with the substrate and an upper layer formed on the intermediate layer,
the upper layer being made up of a single layer consisting of an upper base layer which is a layer in contact with the intermediate layer or multiple layers constituted of two or more layers including the upper base layer,
the substrate having a hexagonal crystal system,
the intermediate layer and the upper base layer having an NaCl crystal structure,
the intermediate layer having a thickness not smaller than 3 nm and not greater than 10 nm,
a mismatch in lattice interplanar spacing in an interface region between the substrate and the intermediate layer being not higher than 65% of a theoretical value of a mismatch in lattice interplanar spacing between the substrate and the upper base layer, and
a mismatch in lattice interplanar spacing in an interface region between the intermediate layer and the upper base layer being not higher than 65% of the theoretical value of the mismatch in lattice interplanar spacing between the substrate and the upper base layer.

2. The surface-coated cutting tool according to claim 1, wherein
the intermediate layer contains a carbide, a nitride, or a carbonitride containing at least one element selected from the group consisting of elements forming the upper base layer and at least one element selected from the group consisting of elements forming the substrate.

3. The surface-coated cutting tool according to claim 2, wherein
the group consisting of the elements forming the upper base layer includes Ti, Cr, Al, and Si, which the intermediate layer contains.

4. The surface-coated cutting tool according to claim 1, wherein
the upper base layer is a TiN layer.

* * * * *